United States Patent
Hawawini et al.

(10) Patent No.: US 9,673,651 B2
(45) Date of Patent: Jun. 6, 2017

(54) DYNAMIC VOLTAGE ADJUST CIRCUITS AND METHODS

(71) Applicant: Qualcomm Incorporated, San Diego, CA (US)

(72) Inventors: Shadi Hawawini, Mountain View, CA (US); VaraPrasad Arikatla, Santa Clara, CA (US); Hee Jun Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 587 days.

(21) Appl. No.: 14/262,181

(22) Filed: Apr. 25, 2014

(65) Prior Publication Data
US 2015/0137598 A1   May 21, 2015

Related U.S. Application Data

(60) Provisional application No. 61/907,304, filed on Nov. 21, 2013.

(51) Int. Cl.
*H02J 7/00* (2006.01)
*G01R 31/00* (2006.01)
*H02M 1/00* (2006.01)

(52) U.S. Cl.
CPC ............ *H02J 7/0052* (2013.01); *G01R 31/00* (2013.01); *H02J 2007/0062* (2013.01); *H02M 2001/007* (2013.01); *H02M 2001/008* (2013.01); *Y10T 307/406* (2015.04)

(58) Field of Classification Search
CPC .................................................. H02J 7/0052
USPC ........................................................... 307/31
See application file for complete search history.

(56) References Cited

U.S. PATENT DOCUMENTS

| | | | |
|---|---|---|---|
| 5,486,749 A | 1/1996 | Brainard | |
| 6,904,488 B2* | 6/2005 | Matsumoto | ......... G06F 13/4068 700/66 |
| 7,880,445 B2 | 2/2011 | Hussain et al. | |
| 7,889,517 B2 | 2/2011 | Artusi et al. | |
| 2008/0054855 A1 | 3/2008 | Hussain et al. | |
| 2011/0298426 A1 | 12/2011 | Hussain et al. | |
| 2013/0257358 A1 | 10/2013 | Hussain et al. | |
| 2013/0335044 A1 | 12/2013 | Raffel et al. | |

FOREIGN PATENT DOCUMENTS

WO   2012028189 A1   3/2012

OTHER PUBLICATIONS

International Search Report and Written Opinion—PCT/US2014/066172—ISA/EPO—Feb. 9, 2015.

* cited by examiner

*Primary Examiner* — Joseph Chang
(74) *Attorney, Agent, or Firm* — Chui-kiu Teresa Wong; Kenneth Vu

(57) ABSTRACT

In one embodiment, an electronic system comprises one or more power circuits configured to receive a first voltage from an external power source and produce a second voltage to one or more electronic components of the electronic system, and a power management circuit configured to determine one or more output currents of the one or more power circuits, wherein the power management circuit causes the external power source to change the first voltage based on at least one output current of at least one power circuit to reduce power loss of the at least one power circuit.

17 Claims, 9 Drawing Sheets

DYNAMIC VOLTAGE ADJUST CIRCUITS AND METHODS

CROSS REFERENCE TO RELATED APPLICATIONS

This application claims the benefit of U.S. Provisional App. No. 61/907,304 filed Nov. 21, 2013, the content of which is incorporated herein by reference in its entirety for all purposes.

BACKGROUND

The present disclosure relates to electronic circuits and methods, and in particular, to circuits and methods for adjusting power supply voltages.

Unless otherwise indicated herein, the approaches described in this section are not admitted to be prior art by inclusion in this section.

Reducing thermals and power dissipation is a big challenge in battery powered and non-battery power electronic devices. For example, most battery charger integrated circuits (ICs) operate at a constant input voltage. However, the efficiency is not constant over the entire battery voltage range. This results in non-optimal efficiency.

In particular, when an electronic device is charging its battery from a wall adapter, CPU intensive, graphics intensive, and modem (wireless) intensive workloads may cause worst case thermal conditions, which can increase skin temperature of the device making the device unusable to a user and possibly even causing damage to the device.

High power consumption trends of current devices also cut across other physical limitations, such as form factor limits on the connector size, which reduces the current limit of the cables used to connect devices to external power supplies, for example.

SUMMARY

The present disclosure relates to adjusting power supply voltages. In one embodiment, changes to a voltage from an external power source is requested by an electronic device based on operating conditions of one or more power circuits in the electronic device.

In one embodiment, the present disclosure includes an electronic system comprising one or more power circuits configured to receive a first voltage from an external power source and produce a second voltage to one or more electronic components of the electronic system, and a power management circuit configured to determine one or more output currents of the one or more power circuits, wherein the power management circuit causes the external power source to change the first voltage based on at least one output current of at least one power circuit to reduce power loss of the at least one power circuit.

In one embodiment, the power management circuit determines whether the one or more output currents of the one or more power circuits are outside a target range and causes the external power source to change the first voltage until one or more output currents of the one or more power circuits are inside the target range responsive to the output currents being outside the target range.

In one embodiment, the power management circuit determines whether a change of operating conditions of the electronic system is occurring, and responsive to no detected change, suspends causing the external power source to change the first voltage.

In one embodiment, one of the one or more power circuits is a switching regulator configured to charge a battery, and wherein the at least one output current is a charge current into the battery, wherein the power management circuit causes the external power source to increase the first voltage until the charge current into the battery meets a set charge current.

In one embodiment, the one or more power circuits comprise at least one switching regulator.

In one embodiment, the power management circuit is configured to poll the one or more electronic components to determine the electronic component that draws the highest power, and further configured to determine whether said electronic component that draws the highest power is a low voltage component, and to cause the external power source to increase the first voltage if the highest power electronic component is not a low voltage component, and to decrease the first voltage if the highest power electronic component is a low voltage component.

In one embodiment, the power management circuit is further configured to cause the external power source to change the first voltage in order to minimize overall voltage conversion loss of the one or more power circuits based on input information of acceptable input voltage ranges, power loss estimations for the acceptable input voltage ranges, and output currents of the one or more power circuits.

In another embodiment, the present disclosure includes a method comprising receiving a first voltage in one or more power circuits of an electronic system from an external power source to provide a second voltage to one or more electronic components of the electronic system, determining an operating condition of the one or more power circuits, and generating signals from the electronic system to the external power source to change the first voltage responsive to the determined operating condition.

In one embodiment, the operating condition is power drawn by one or more power circuits. Generating the signals from the electronic system to the external power source to change the first voltage is to reduce power loss in the electronic system.

In one embodiment, the method further comprises determining whether the second voltage to one or more electronic components are outside a target range, and generating the signals from the electronic system to the external power source to change the first voltage responsive to the second voltage to one or more electronic components being outside the target range.

In one embodiment, one of the one or more power circuits is a switching regulator configured to charge a battery. At least one charge current into the battery is associated with the second voltage associated with the switching regulator. The method further comprises generating the signals from the electronic system to the external power source to increase the first voltage until the charge current into the battery meets a set charge current.

In one embodiment, the method further comprises polling the one or more electronic components to determine the electronic component that draws the highest power, and determining whether said electronic component that draws the highest power is a low voltage component. Generating the signals from the electronic system to the external power source further comprises generating the signals from the electronic system to the external power source to increase the first voltage responsive to said electronic component not being a low voltage component and to decrease the first voltage responsive to said electronic component being a low voltage component.

In one embodiment, the one or more power circuits comprise at least one switching regulator.

In one embodiment, the present disclosure includes a method comprises determining an optimal voltage of an external power source in order to minimize overall voltage conversion loss on a plurality of power circuits inside a computing system based on input information of acceptable input voltage ranges, power loss estimations for the acceptable input voltage ranges, and output currents of the plurality of power circuits.

In one embodiment, the one or more power circuits comprise at least one voltage regulator.

In one embodiment, the method further comprises assigning priority to one power circuit based on an operating condition of the power circuit, and determining the optimal voltage further based on the assigned priority.

In one embodiment, one power circuit is a battery charger and the operating condition is charging of a battery.

In one example embodiment, an input voltage may be specified based on a battery voltage and current (input or output) in a battery charger to obtain high efficiency operation. In other embodiments, an input voltage may be specified to reduce overall power dissipation and heat generation to reduce skin temperature and other temperatures in the system. When some components of the electronic device enter high power states, such component's requirements may be factored into a determination of a requested input voltage to optimize overall system efficiency.

In one example embodiment, a high voltage dedicated charge port (HVDCP), for example, produces a voltage to a battery charger integrated circuit or system load based on a high efficiency point tracking algorithm.

In another embodiment, the present disclosure includes a software algorithm. For example, the software algorithm may perform a method comprising determining an optimal voltage of an external power source in order to minimize overall voltage conversion loss on a plurality of voltage regulators inside a computing system based on input information of acceptable input voltage ranges, power loss estimations for the acceptable input voltage ranges, and output currents of the plurality of voltage regulators.

In one embodiment, multiple power circuits (e.g., regulators) may report output voltage and output current for processing by an algorithm. The algorithm may determine an acceptable range for each power circuit (e.g., using stored upper voltages and lower bounds based on the reported output voltage and a stored margin). The acceptable ranges and output currents and/or voltages of each regulator may be used to maximize combined conversion efficiency of the power circuits by setting an external voltage from an external power source.

In another embodiment, additional voltage margin from the external power source can be dynamically adjusted based on the total system current loading and IR drop from the external power source to the computing system.

In one embodiment, input information about each internal voltage regulator may be maintained by a centralized controller or maintained by each voltage regulator, for example, and 'voted' (reported) from each voltage regulator to a centralized controller for the voltage range and preferred voltage in order to determine the optimal voltage of external power source meeting the range constraints and minimizing the conversion loss inside the computing system.

In one embodiment, an electronic device includes a switch mode battery charger (SMBC), switch mode power supplies (SMPSs), and one or more boost SMPSs. Each power circuit may report an 'acceptable input voltage range' and a 'power loss estimation' for the voltage range at the current load (e.g., V_range_SMBC, P_loss_SMBC (V_range_SMBC, I_SMBC_output), V_range_SMPS, P_loss_SMPS (V_range_SMPS, I_SMPS_output), V_range_Boost, P_loss_Boost (V_range_Boost, I_Boost_output)).

In one embodiment, the electronic device may measure and report the adapter current.

In one embodiment, a main power management integrated circuit (PMIC) may decide an optimal target adapter output voltage and send the request to the external power source so that the voltage from the external power source is within all acceptable ranges, minimizes the power loss of SMBC+SMPSs+Boost SMPS within the ranges, and is higher than: (current system power+guard band)/max connector current limit. In response to signals from a main PMIC, the external power source may change the adapter output voltage to the target that the main PMIC requested, for example.

DETAILED DESCRIPTION

The present disclosure pertains to adjusting voltage provided to a system to improve system performance. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
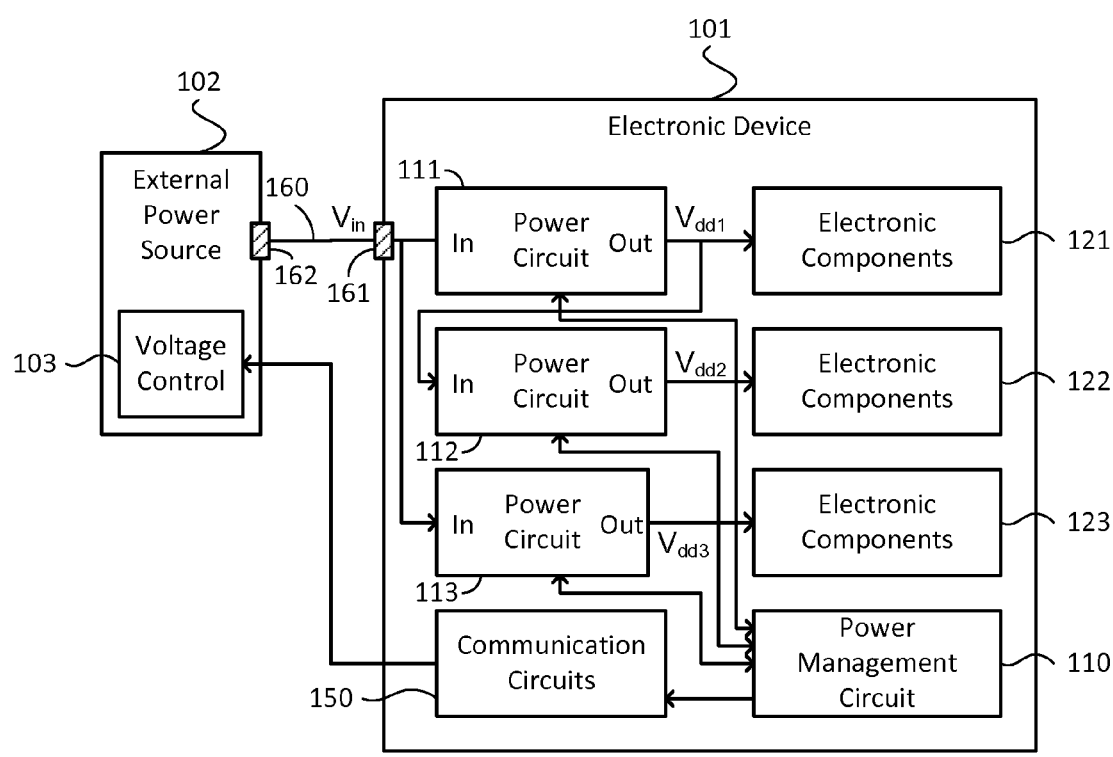
FIG. 1 illustrates a block diagram of a dynamic voltage adjust system according to one embodiment.

FIG. 1 illustrates a block diagram of a dynamic voltage adjust system 100 according to one embodiment. FIG. 1 shows an electronic device 101 coupled to an external power source 102. External power source 102 provides a voltage Vin (also referred to herein as VBUS) and current to electronic device 101. Electronic device 101 may include one or more power circuits (e.g., power circuits 111, 112, and 113) that receive the voltage VBUS from external power source 102 and provide voltage and current to one or more electronic components (e.g., electronic components 121, 122 and 123), such as processors, wireless transceivers, display circuits (e.g., backlights), or battery chargers, for example. In this example, external power source 102 is coupled to electronic device 101 via a cable 160 that is attached using connectors 161 and 162. Cable 160 may include wires for voltage Vin and ground, as well as one or more data wires for communicating information between electronic device 101 and external power source 102.

External power source 102 may be a universal serial bus (USB) host, a USB hub, or a wall adapter that plugs into a power outlet and converts AC power to DC power, for example. One example wall adapter that may be used in certain embodiments is a high voltage dedicated charge port (HVDCP). Embodiments using HVDCP may adjust the externally supplied voltage, for example. In the case where the power circuit is a battery charger and the electronic component is a battery, and depending on the battery voltage, the input voltage from the external power source 102 can be adjusted so that charging and system load is always operating at a high (or even maximum) efficiency. External power source 102, such as an HVDCP, may include a voltage control component 103 that may change the voltage Vin to different levels, for example, in response to signals received over cable 160 from a communication circuit 150 in electronic device 101.

In this example, voltage Vin from external power source 102 is coupled to power circuit 111. Power circuit 111 receives voltage Vin and produces an output voltage Vdd1 to electronic components 121. Power circuit 111 may send and/or receive signals to and/or from a power management circuit 110. Power management circuit 110 may configure power circuit 111 for operation, such as configuring the voltage Vdd1 or current outputs, for example. In some applications, an output of one power circuit may be provided as an input to another power circuit. For example, the voltage Vdd1 from power circuit 111 may be provided as an input to power circuit 112. Power circuit 112 may generate another output voltage Vdd2 to electronic components 122. Similarly, power circuit 112 may send and/or receive signals to and/or from a power management circuit 110. Power management circuit 110 may configure power circuit 112 for operation, such as configuring the voltage Vdd2 or current outputs, for example. Finally, in this example, another power circuit 113 receives voltage Vin and produces an output voltage Vdd3 to electronic components 123. Power circuit 113 may send and/or receive signals to and/or from a power management circuit 110. Power management circuit 110 may configure power circuit 113 for operation, such as configuring the voltage Vdd3 or current outputs, for example. In some examples implementations, power management circuit 110 may be a power management integrated circuit (PMIC) including one or more power circuits, while other example implementations may have distinct power circuits separate from the PMIC (e.g., some battery charger applications). Additionally, in some embodiments, one or more power circuits 111, 112, and/or 113 may be switching regulators, for example, and others may be low dropout regulators (LDOs).

Features and advantages of the present disclosure may include adjusting the voltage Vin from external power supply 102 to improve the efficiency of one power circuit 111, 112, 113 or even multiple power circuits 111, 112, 113 operating together. In one embodiment, one of the power circuits 111, 112, 113 may be a battery charger, for example, charging a battery using a particular charge current. If the voltage Vin from the external power source is too low, the full amount of desired charge current may not be available from power circuit 111, 112, 113. Thus, the electronic device 101 may send signals to external power source 102 (e.g., via communication circuit 150) to increase the voltage Vin so that power circuit 111, 112, 113 may provide the desired value of charge current. More generally, given the current loads of one or more power circuits 111, 112, 113 in electronic device 101, the voltage received from external power source 102 may be changed to optimize the efficiency and performance of power circuits 111, 112, 113. In one example embodiment described in more detail below, multiple power circuit operating conditions may be analyzed by the power management circuit to determine if an increase or decrease in the external power supply voltage Vin would result in improved efficiency.

Figure 2:
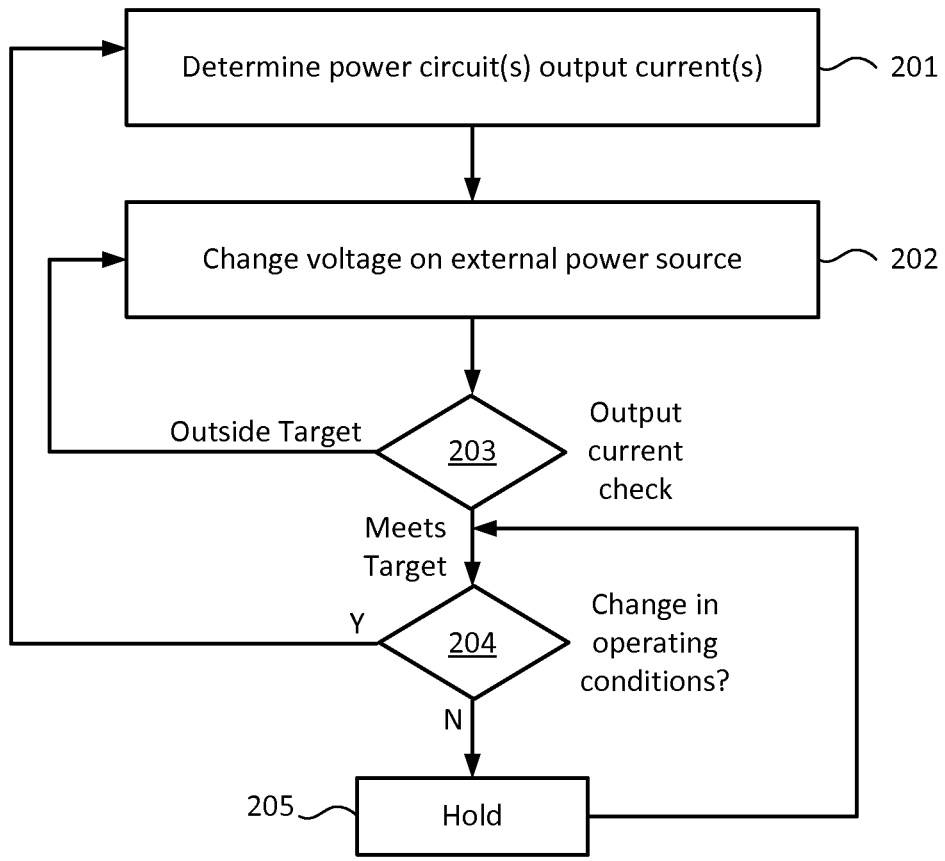
FIG. 2 illustrates a method for dynamic voltage adjust according to one embodiment.

FIG. 2 illustrates a method 200 for dynamic voltage adjust according to one embodiment. At 201, one or more power circuit output currents may be determined For example, an output current of a battery charger may be sensed as described in more detail below. Based on the operation of power circuits 111, 112, 113, the voltage from an external power source may be changed at 202 to improve the efficiency of power circuits 111, 112, 113, for example. At 203, an output current check may be conducted. For example, a battery charger circuit may perform a check to determine if the magnitude of a charge current into a battery is equal to a set (or target) charge current value. If the current does not meet a target, then the system may loop back to 202 from 203, and in the battery charger case increase the voltage from the external power source. Similarly, if the output current check meets the target and does not cause a further change in the power supply voltage Vin, then a change in operating conditions at 204 may cause the system to loop back to 201 and determine the power circuit output currents and adjust the power source voltage as described above. The system may hold the power source voltage Vin at 205 until a change in operating conditions, for example.

Figure 3:
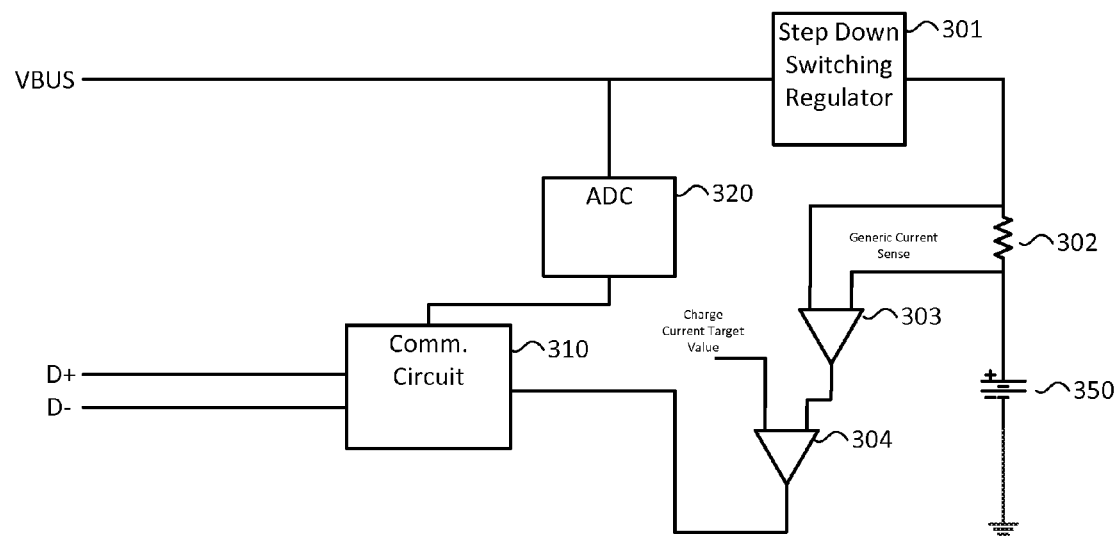
FIG. 3 illustrates dynamic voltage adjust of a battery charger circuit according to one embodiment.

FIG. 3 illustrates dynamic voltage adjust of a battery charger circuit according to one embodiment. FIG. 3 shows an example where a battery charger receives a voltage, VBUS, from an external power source and couples voltage and current to a battery 350 to charge the battery, for example. In this example, the power circuit is a switching regulator 301, and VBUS is greater than that voltage provided to the battery 350. Accordingly, switching regulator 301 is a step down (or "Buck") DC-DC converter. Switching regulator 301 may be configured to produce a set amount of current into battery 350 to charge the battery (e.g., current Ichg), and may include a feedback loop (not shown) to sense output current and configure the switching regulator 301 to produce the desired charge current. For example, in one embodiment, the switching regulator 301 may be configured to generate charge current Ichg=3 A.

Initially, VBUS is configured to a low setting. For example, if the external power source is a programmable adapter or USB source, the initial voltage on VBUS may be 5v. However, the external power source may have a maximum output current (Imax), where the total output power available from the external power source is Imax*VBUS. If Imax is too low, the external power source may not be able to provide enough power to switching regulator 301 to allow the switching regulator to generate the set amount of charge current. Thus, some example embodiments may sense output current (e.g., Ichg) and compare the actual output current to the desired (or expected) output current. Current sensing may be performed with a series resistor 302 (as shown in FIG. 3) or using a sense FET (i.e., a small FET configured to detect current through the regulator), for example. In this example, sense resistor 302 detects charge current Ichg using amplifier 303. The output of amplifier 303 is provided to comparator 304, which compares the detected current to the set (or target) charge current value. Additionally, the circuit may optionally include an analog-to-digital converter 320 to detect the voltage from the external device at the input of the switching regulator 301 to determine the voltage on VBUS. If the detected charge current is below the target charge current, the comparator output may trigger communication circuit 310 to communicate with the external power source to increase the voltage on VBUS. In this example, communication between an electronic device and external power source may be over a two wire interface, which in this case is are the D+ and D− data lines of a USB connection. In response to the signals on D+/D− from communication circuit 310, the external power source may incrementally increase the voltage on VBUS until the detected charge current is equal to the target charge current.

Figure 4:
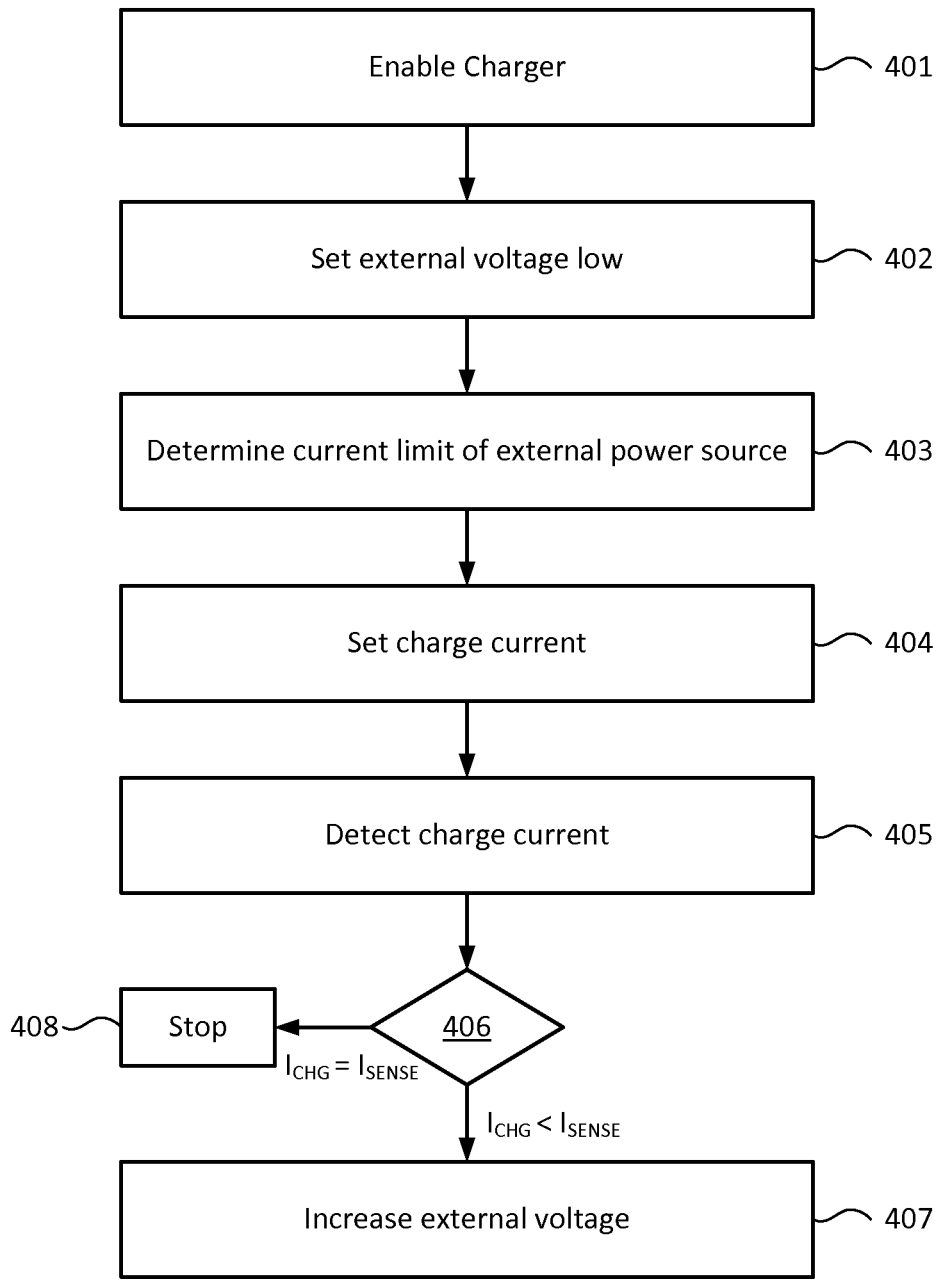
FIG. 4 illustrates a method for dynamic voltage adjust including a battery charger circuit according to one embodiment.

FIG. 4 illustrates a method 400 for dynamic voltage adjust including a battery charger circuit according to one embodiment. At 401, a battery charger may be enabled. At 402, the external voltage may be set to a low value (e.g., a minimum value of available values). At 403, the current limit of the external power source may be determined to determine maximum output current available from the external power source. At 404, a charge current (Ichg) is set. In one embodiment, for example, charge current may be programmed digitally, to one of a plurality of available values. At 405, the charge current into a battery is detected. If the detected charge current (Isense) is less than the set charge current (Ichg) at 406, then the electronic device may signal the external power source to increase the voltage. The external voltage may be increased (e.g., to the next available value above the current value) at 407. If set charge current Ichg is equal to sense current Isense, then the process may stop at 408. The external power source may maintain the voltage on VBUS until circuit operating conditions change and the process may be repeated under different conditions, for example.

Figure 5:
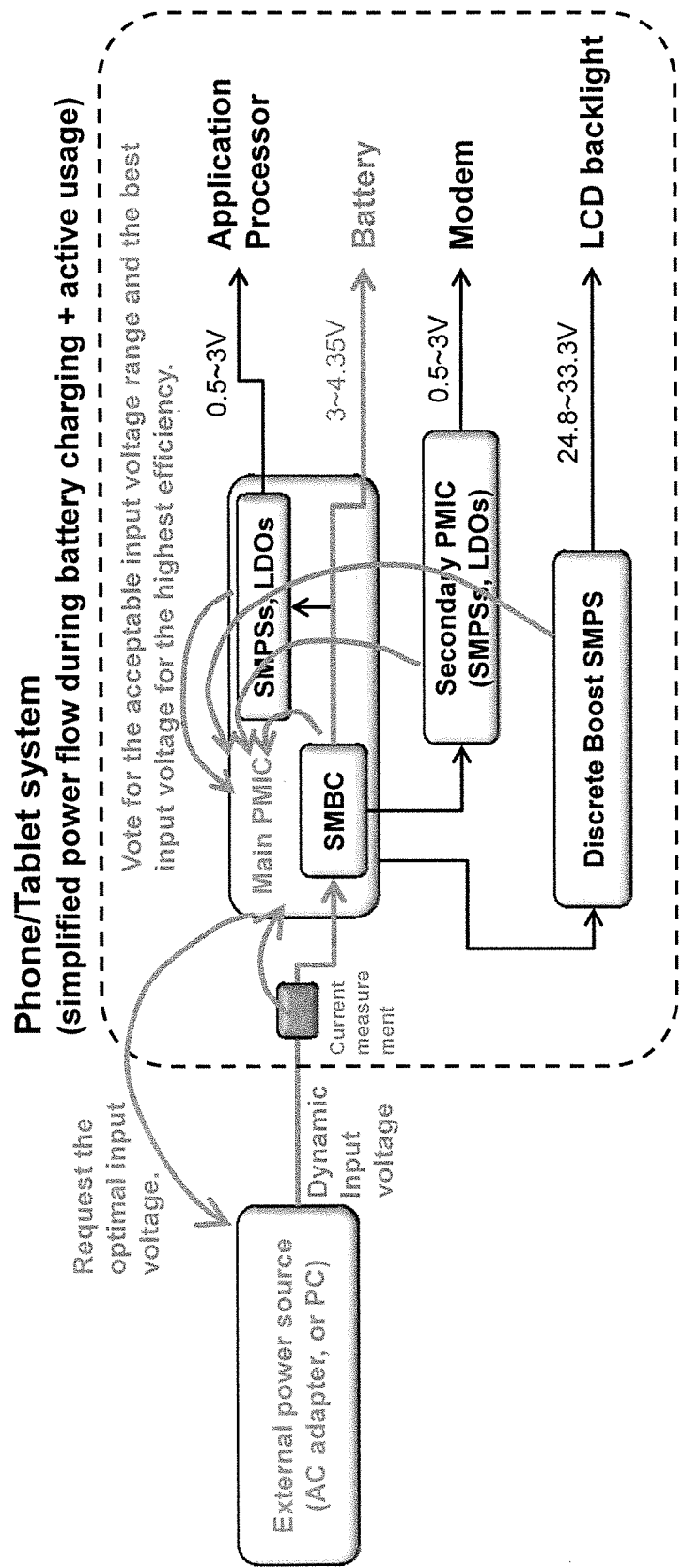
FIG. 5 shows an example of dynamic voltage adjust according to another embodiment.

FIG. 5 shows an example of dynamic voltage adjust according to another embodiment. In the example illustrated by FIG. 5, information from multiple different power circuits are combined to determine the voltage provided by an external power source. In this example, a main PMIC may include a switched mode battery charger (SMBC) power circuit for charging a battery, and one or more switch mode power supplies (SMPS) and LDOs to provide voltage and current to an application processor, for example. Additionally, the SMBC provides voltage and current to a secondary SMPS and LDOs to provide voltage and current to a modem (e.g., one or more transceivers), for example, and voltage and current to a SMPS for increasing (boosting) the voltage for an LCD backlight, for example.

In this example, changing the system input voltage may minimize the losses and heat generation caused by the SMBC and SMPCs, for example. Additionally, if the system total current is approaching the connector current limit, an increase in the external power source voltage allows more power into the system (e.g., at lower current), for example.

Each regulator may report, for example in response to polling, an acceptable input range and power loss estimation for the voltage range at the current load current. For example, in one embodiment, each regulator may measure output voltage and output current and send this information to a PMIC. The measured output voltage of each regulator may be used to determine an acceptable range of input voltages. For instances, an upper bound of an acceptable input voltage range may be a prestored value corresponding to maximum input voltage for the particular regulator beyond which damage to the regulator may occur. The lower bound may be determined by combining the reported output voltage with a prestored margin (e.g., an amount that the input voltage must be greater than the output voltage for the particular regulator to operate). One or more conversion efficiencies may be stored as a lookup table or encoded as an equation, for example. Accordingly, an algorithm may determine an external power source voltage to achieve a maximum combined efficiency of the combined power circuits based on operating conditions of the individual power circuits (e.g., output voltage and output current of each regulator). In various embodiments, an algorithm for receiving information from multiple regulators and determining a new output voltage from an external power source to improve system efficiency may be implemented as software or firmware on a PMIC or as software on a processor (e.g., a PMIC driver) and stored on a non-transitory computer readable medium such as a volatile or non-volatile memory, for example. SMBC may report an 'acceptable input voltage range' (V_range_SMBC) and a 'power loss estimation' (P_loss_SMBC(V_range_SMBC, I_SMBC_output)) for the voltage range at the current load. SMPS may report an 'acceptable input voltage range' (V_range_SMPS) and a 'power loss estimation' (P_loss_SMPS (V_range_SMPS, I_SMPS_output)) for the voltage range at the current load. Discrete boost SMPS may report an 'acceptable input voltage range' (V_range_Boost) and a 'power loss estimation' (P_loss_Boost (V_range_Boost, I_Boost_output)) for the voltage range at the current load, Additionally, the adapter current into the system from the external power source may be measured and reported to the PMIC. The main PMIC may decide the optimal target external power source voltage and send the request to the external power source (e.g., USB or adapter). The PMIC may determine the external source type (e.g., USB type or adapter type) and signal the external source for voltages that the external source is capable of producing. An algorithm in the PMIC may minimize power loss of the SMBC, SMPSs, and Boost SMPS within the voltage ranges available from the particular external power source, for example. In one embodiment, the external source voltage may be advantageously higher than the current system power plus a guardband divided by the maximum connector current limit, for example. Changing conditions, such as modem (wireless) activity, application processor (e.g., ARM, graphics processors, etc. . . . ) activity, battery charging, etc. . . . may cause the system to signal the external power source to change the external voltage supplied to the system, for example. Benefits of these techniques may include lower temperatures while battery charging, more thermal budget for CPU and graphics intensive workloads. Additionally, faster battery charging may be achieved because there is better thermal room for the SMBC. Further, improved efficiencies and thermal performance may result in reduced form factor, thinner designs, and allow the use of a standard USB connector that may have current limitations, for example. Embodiments of the present invention may be implemented using High Voltage Dedicated Charge Ports (HVDCP) wall adapters, for example, and USB cables with no change required in compatible USB systems in some embodiments, for example.

Figure 6:
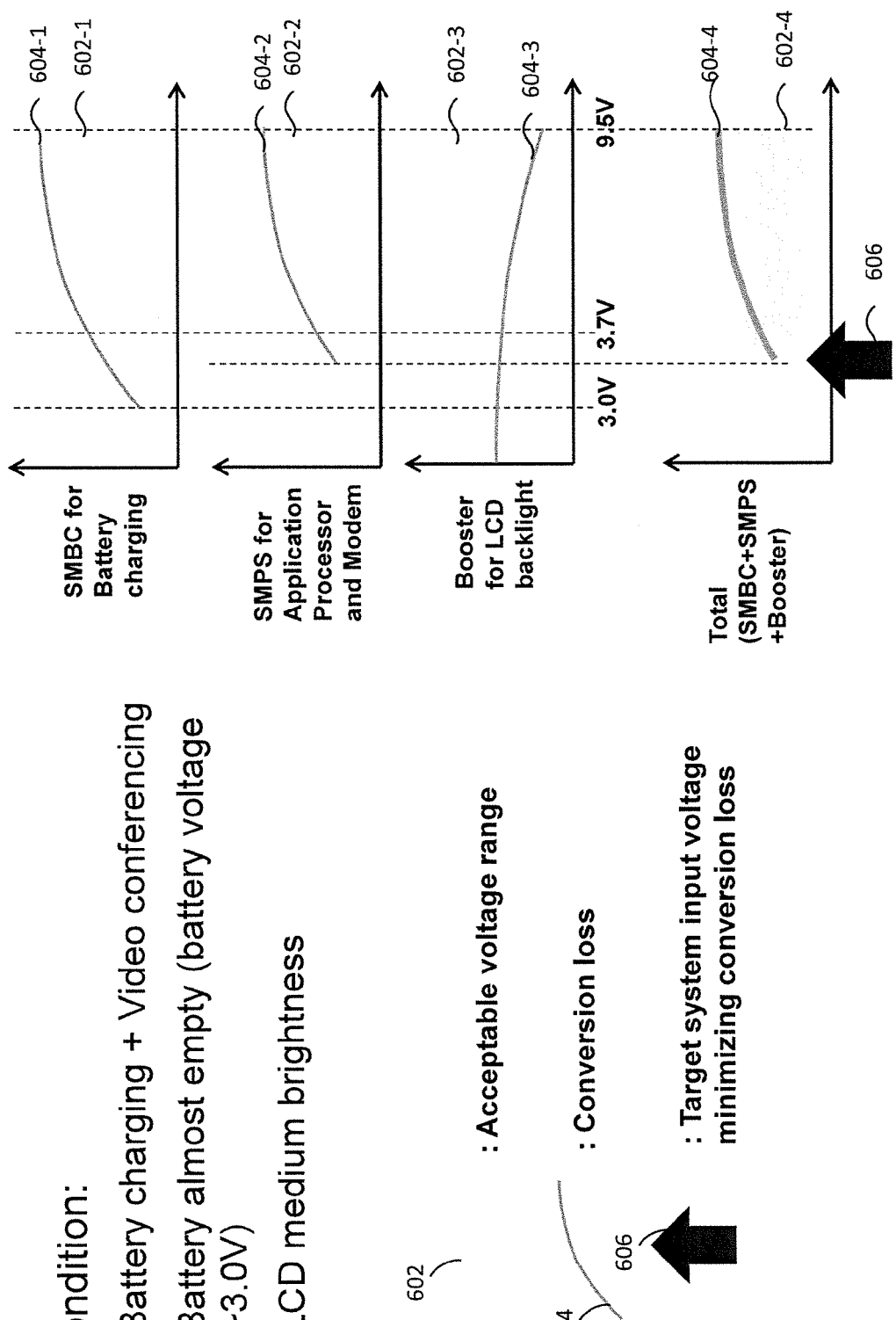
FIG. 6 shows another example of dynamic voltage adjust according to another embodiment.

FIG. 6 shows another example of dynamic voltage adjust according to another embodiment. In FIG. 6, acceptable voltage ranges 602-1, 602-2, and 602-3 and power losses 604-1, 604-2, and 604-3 are shown for a condition where the electronic device operating condition is where the battery is charging, a video conference is being conducted, the battery is almost empty (e.g., battery voltage approximately 3.0 V), and the liquid crystal display (LCD), respectively, is set to medium brightness. As illustrated, the battery charger conversion loss 604-1 and processor/modem SMPS conversion loss 604-2 increases with increasing input voltage, but the conversion loss 604-3 for the booster decreases with increasing voltage. Accordingly, a system optimum, as shown by arrow 606, may occur between about 3 and 3.7 volts as shown at the boundary of an acceptable system voltage range 602-4 for the externally supplied voltage (the range of external voltages that may be supplied to the system) and have a total conversion loss 604-4 in the range 602-4. In some embodiments, the battery charging is given priority over video conferencing, and thus the associated power circuit for battery charging is given priority over the associated power circuit for video conferencing. Therefore, the total conversion loss 604-4 becomes the same as or substantially the same as the conversion loss 604-1 for the battery charging. The method for the dynamic voltage adjust of FIG. 6 can be implement by the method of FIG. 8, for example.

Figure 7:
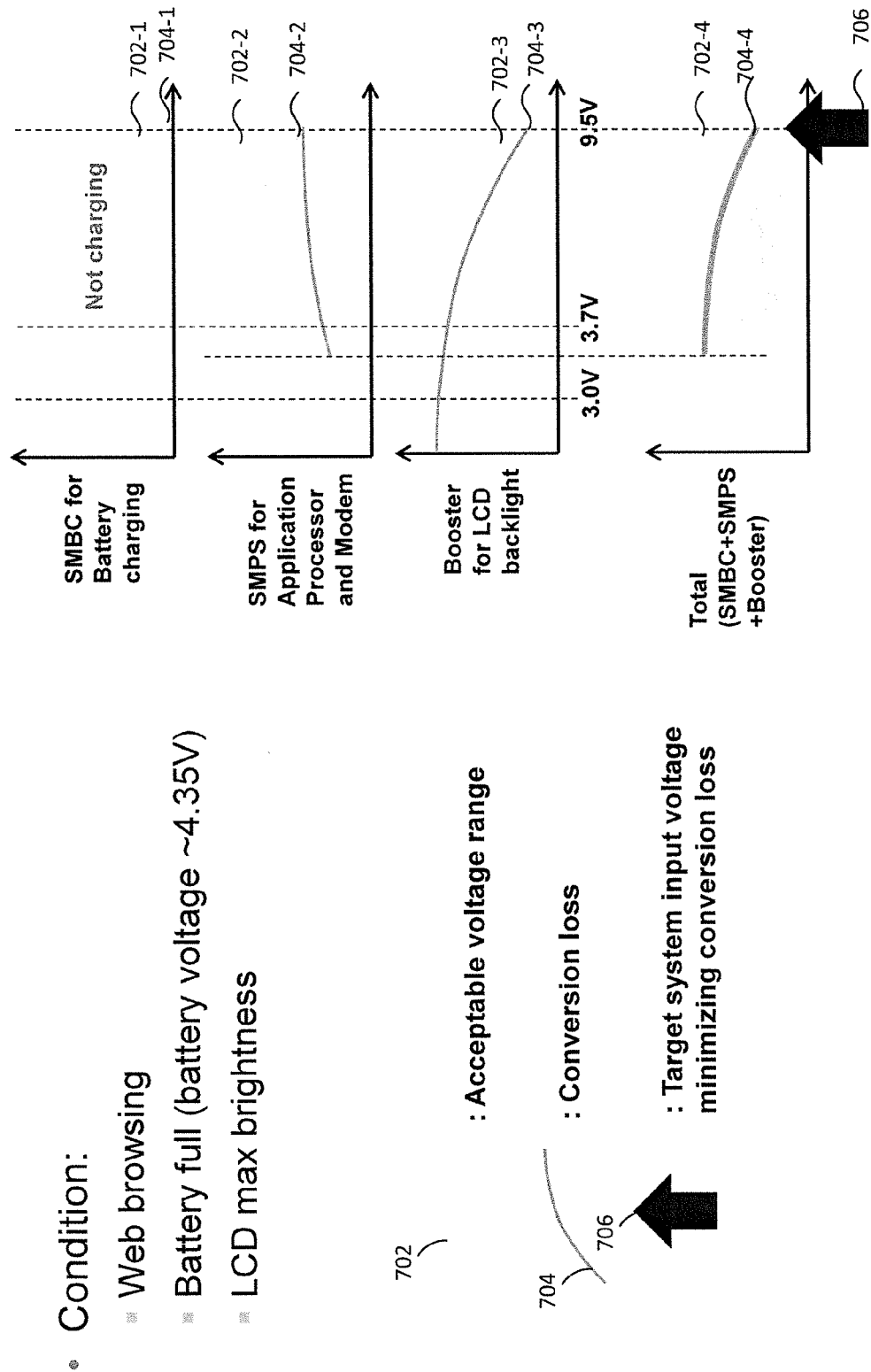
FIG. 7 shows another example of dynamic voltage adjust according to another embodiment.

FIG. 7 shows another example of dynamic voltage adjust according to another embodiment. In this example, the operating conditions are web browsing is occurring, the battery is full (e.g., battery voltage approximately 4.35 V), and the battery charger is turned off, and the LCD is at maximum brightness. As illustrated, the battery charger conversion loss 704-1 is shown as the zero line in the acceptable voltage range 702-1 and can be ignored. Processor/modem SMPS conversion loss 704-2 increases (although at a lower rate than in FIG. 6) with increasing input voltage in the acceptable voltage range 702-2, but the conversion loss 704-3 for the booster decreases (although at a higher rate than in FIG. 6) with increasing voltage in the acceptable voltage range 702-3. In this example, the system optimum, as shown by arrow 706, may occur at the other boundary of the acceptable system voltage range 702-4 around 9.5 V, for example. The method for the dynamic voltage adjust of FIG. 7 can be implement by the method of FIG. 8, for example.

Figure 8:
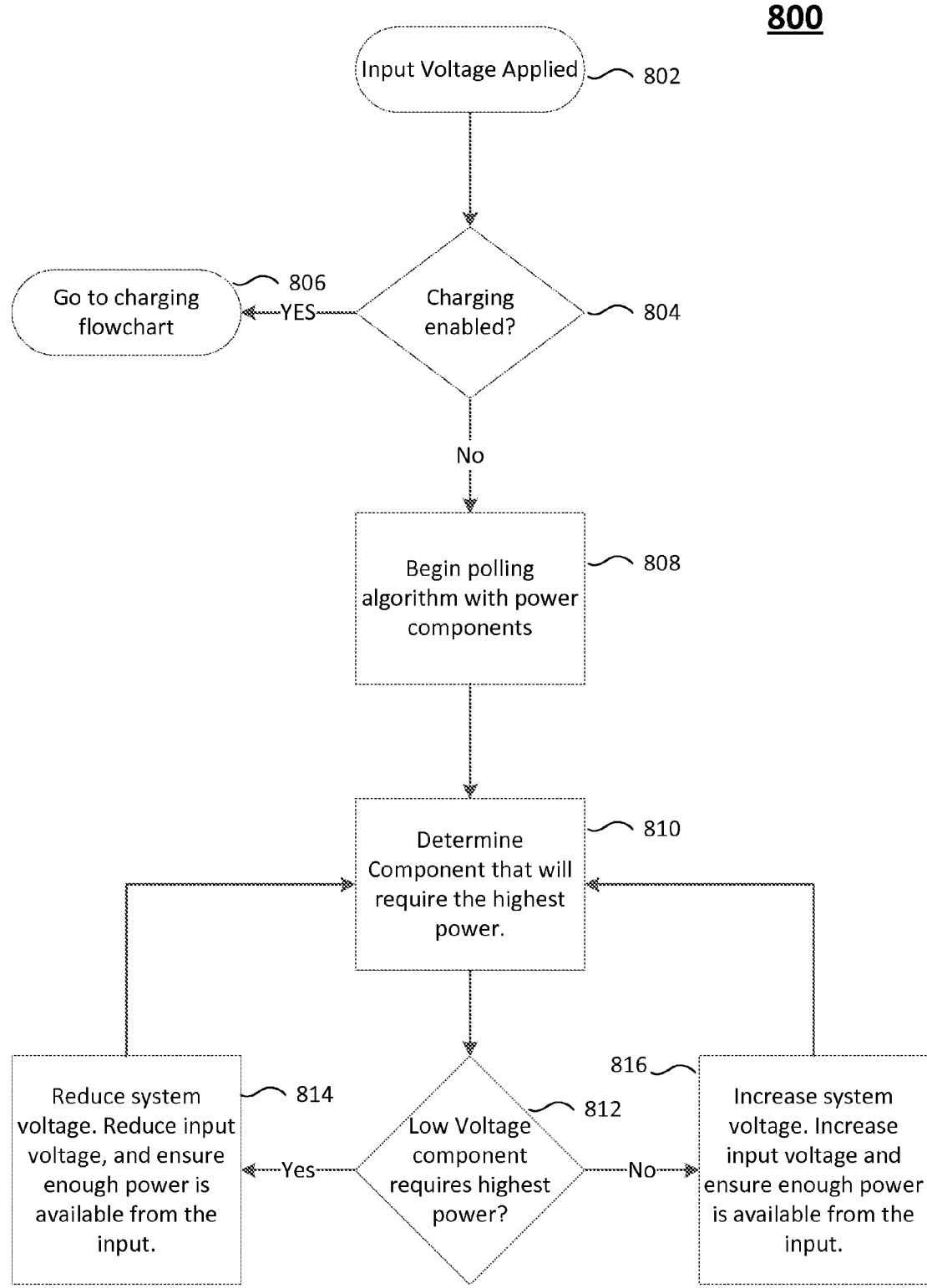
FIG. 8 illustrates a method for dynamic voltage adjust for polling according to one embodiment.
Figure 9:
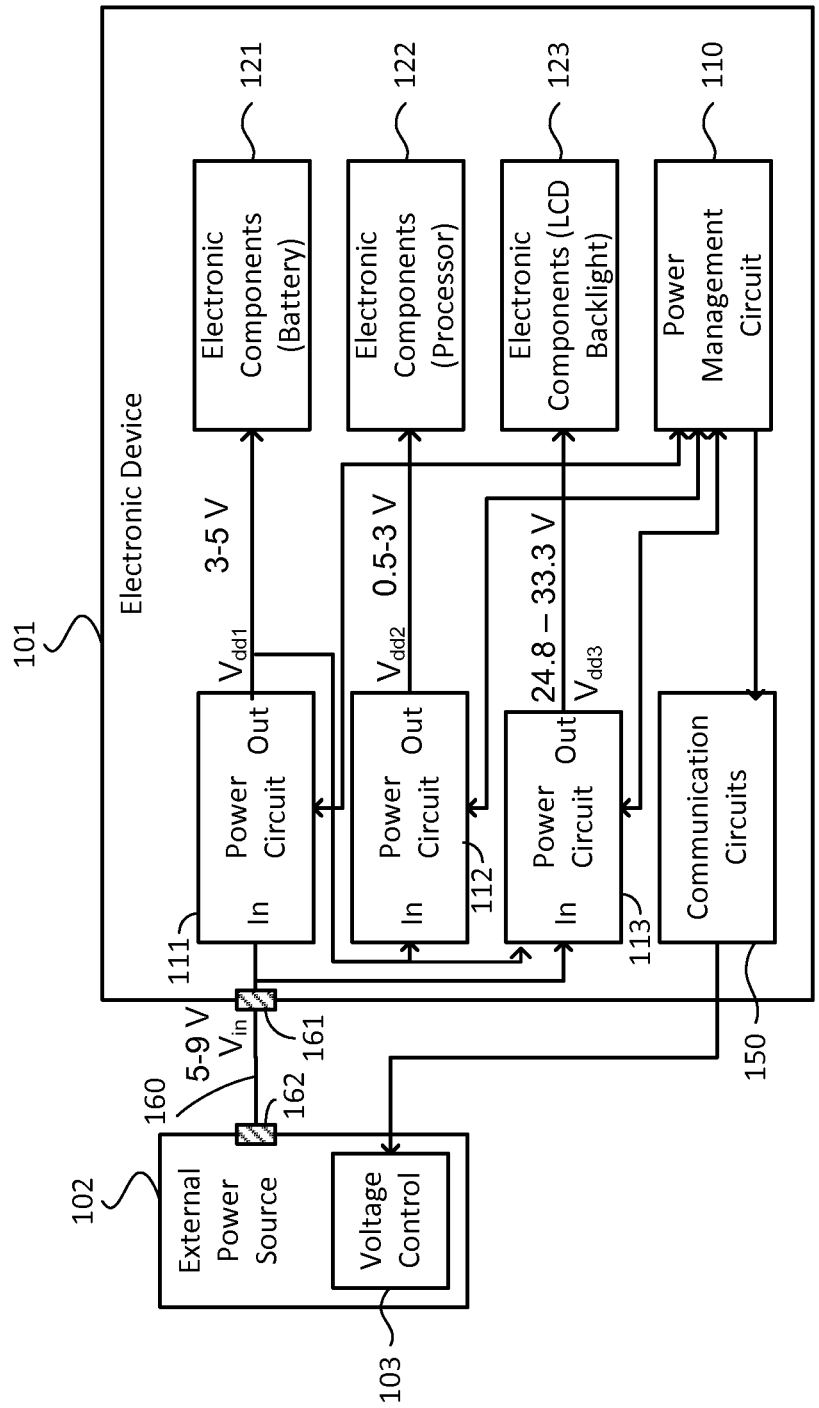
FIG. 9 illustrates a block diagram of a dynamic voltage adjust system according to another embodiment.

FIG. 8 illustrates a method 800 for dynamic voltage adjust according to one embodiment. FIG. 9 illustrates a block diagram of a dynamic voltage adjust system 900 according to one embodiment. Dynamic voltage adjust system 900 is an illustrative example of dynamic voltage adjust system 100 in which electronic components 121 is a battery charger, electronics components 122 is a processor and electronics components 123 is an LCD backlight. Further, the voltage Vdd1 is also applied to power circuit 113. In this example, the input voltage Vin is 5-9 V. Power circuit 111 steps down the voltage, for example, by using a buck converter, to a range of 3-5 V. Power circuit 111 provides the voltage to the power circuits 112 and 113. Power circuit 112 steps down the voltage to a range of 0.5-3 V, and power circuit 113 steps up the voltage to a range of 24.8-33.3 V.

Referring to FIG. 8, at 802, input voltage Vin is applied to electronic device 101. At 804, power management circuit 110 determines whether charging is enabled. If charging is enabled, at 806, power management circuit 110 executes a charging method, such as method 400 (see FIG. 4). In some embodiments, the charging is given priority over other power circuits, and thus the method 400 is executed. Otherwise, if, at 804, charging is not enabled, power management circuit 110 begins a polling algorithm. At 810, power management circuit 110 determines which electronic component 122, 123 will require the highest power. At 812, power management circuit 110 determines if the electronic component 122, 123 that will require the highest power is a low voltage component. In the example of FIGS. 7 and 9, electronic components 123 (the LCD backlight) has the highest power draw. If the electronic component is a low voltage component, at 814, power management circuit 110 reduces the system voltage by reducing the input voltage Vin, and ensures that sufficient power is available from the input voltage Vin, and returns to determining the component at 810. Otherwise, if, at 812, the electronic component is not a low voltage component, at 816, power management circuit 110 increases the system voltage by increasing the input voltage Vin, and ensures that sufficient power is available from the input voltage Vin, and returns to determining the component at 810. In this example, the LCD backlight is not a low voltage component, thus, power management circuit 110 increases the input voltage Vin from external power source 102. In this example, the input voltage Vin is increased to the upper end of the range to be close to 9 V. This improves the efficiency because the voltage boost by power circuit 113 is from 9 V rather than a lower voltage such as 5 V. In another example, if the high power drawing component was the processor, which was also the low voltage component. The input voltage Vin would be reduced to the lower end of the range so that the step down in voltage for the processor is from 5 V to 0.5-3 V rather than stepping down from 9 V.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. An electronic system comprising:
   one or more power circuits configured to receive a first voltage from an external power source and produce a second voltage to one or more electronic components of the electronic system; and
   a power management circuit configured to determine one or more output currents of the one or more power circuits,
   wherein the power management circuit causes the external power source to change the first voltage based on at least one output current of at least one power circuit to reduce power loss of the at least one power circuit.

2. The circuit of claim 1 wherein the power management circuit determines whether the one or more output currents of the one or more power circuits are outside a target range and causes the external power source to change the first voltage until one or more output currents of the one or more power circuits are inside the target range responsive to the output currents being outside the target range.

3. The circuit of claim 1 wherein the power management circuit determines whether a change of operating conditions of the electronic system is occurring, and responsive to no detected change, suspends causing the external power source to change the first voltage.

4. The circuit of claim 1 wherein one of the one or more power circuits is a switching regulator configured to charge a battery, and wherein the at least one output current is a charge current into the battery, wherein the power management circuit causes the external power source to increase the first voltage until the charge current into the battery meets a set charge current.

5. The circuit of claim 1 wherein the one or more power circuits comprise at least one switching regulator.

6. The circuit of claim 1 wherein the power management circuit is configured to poll the one or more electronic components to determine the electronic component that draws the highest power, and further configured to determine whether said electronic component that draws the highest power is a low voltage component, and to cause the external power source to increase the first voltage if the highest power electronic component is not a low voltage component, and to decrease the first voltage if the highest power electronic component is a low voltage component.

7. The circuit of claim 1 wherein the power management circuit is further configured to cause the external power source to change the first voltage in order to minimize overall voltage conversion loss of the one or more power circuits based on input information of acceptable input voltage ranges, power loss estimations for the acceptable input voltage ranges, and output currents of the one or more power circuits.

8. A method comprising:
receiving a first voltage in one or more power circuits of an electronic system from an external power source to provide a second voltage to one or more electronic components of the electronic system;
determining an at least one output current of the one or more power circuits; and
generating signals from the electronic system to the external power source to change the first voltage based on the at least one output current of at least one power circuit to reduce power loss of the at least one power circuit.

9. The method of claim 8 wherein the operating condition is power drawn by one or more power circuits,
wherein generating the signals from the electronic system to the external power source to change the first voltage is to reduce power loss in the electronic system.

10. The method of claim 8 further comprises:
determining whether the second voltage to one or more electronic components are outside a target range; and
generating the signals from the electronic system to the external power source to change the first voltage responsive to the second voltage to one or more electronic components being outside the target range.

11. The method of claim 8 wherein one of the one or more power circuits is a switching regulator configured to charge a battery, and wherein at least one charge current into the battery is associated with the second voltage associated with the switching regulator,
the method further comprising generating the signals from the electronic system to the external power source to increase the first voltage until the charge current into the battery meets a set charge current.

12. The method of claim 8 further comprises:
polling the one or more electronic components to determine the electronic component that draws the highest power; and
determining whether said electronic component that draws the highest power is a low voltage component;
wherein generating the signals from the electronic system to the external power source further comprises generating the signals from the electronic system to the external power source to increase the first voltage responsive to said electronic component not being a low voltage component and to decrease the first voltage responsive to said electronic component being a low voltage component.

13. The method of claim 8 wherein the one or more power circuits comprise at least one switching regulator.

14. A method comprising:
determining an optimal voltage of an external power source in order to minimize overall voltage conversion loss on a plurality of power circuits inside a computing system based on input information of acceptable input voltage ranges, power loss estimations for the acceptable input voltage ranges, and output currents of the plurality of power circuits.

15. The method of claim 14 wherein the one or more power circuits comprise at least one voltage regulator.

16. The method of claim 14 further comprising:
assigning priority to one power circuit based on an operating condition of the power circuit; and
determining the optimal voltage further based on the assigned priority.

17. The method of claim 16 wherein said one power circuit is a battery charger and the operating condition is charging of a battery.

* * * * *